US008642116B2

(12) United States Patent
Harkins et al.

(10) Patent No.: US 8,642,116 B2
(45) Date of Patent: Feb. 4, 2014

(54) CARTRIDGE BLOCK FOR MULTILAYER CERAMIC SCREENING

(75) Inventors: William W. Harkins, Montgomery, NY (US); Christos T. Kapogiannis, Pleasant Valley, NY (US); Gerald H. Leino, Newburgh, NY (US); Robert Weiss, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 12/938,408

(22) Filed: Nov. 3, 2010

(65) Prior Publication Data
US 2012/0107489 A1 May 3, 2012

(51) Int. Cl.
*B05D 5/12* (2006.01)

(52) U.S. Cl.
USPC ............................ 427/79; 427/97.1; 427/97.7

(58) Field of Classification Search
USPC ..................................... 427/97.7, 79
See application file for complete search history.

(56) References Cited

U.S. PATENT DOCUMENTS

| 4,362,486 A | 12/1982 | Davis et al. | |
|---|---|---|---|
| 5,955,119 A * | 9/1999 | Andris et al. | 425/461 |
| 6,067,906 A * | 5/2000 | Ryan et al. | 101/335 |
| 6,308,868 B1 | 10/2001 | Hoffman et al. | |
| 6,453,810 B1 * | 9/2002 | Rossmeisl et al. | 101/123 |
| 6,511,301 B1 | 1/2003 | Fugere | |
| 6,513,680 B2 * | 2/2003 | Nakayoshi et al. | 222/1 |
| 6,796,987 B2 | 9/2004 | Tague et al. | |
| 6,817,492 B1 | 11/2004 | Smith | |
| 7,448,857 B1 | 11/2008 | Fugere | |
| 2002/0112882 A1 * | 8/2002 | Hirakawa | 174/256 |
| 2007/0235175 A1 | 10/2007 | DeGroot et al. | |
| 2009/0001096 A1 | 1/2009 | Wagner et al. | |
| 2009/0052971 A1 | 2/2009 | Pires et al. | |
| 2009/0261121 A1 * | 10/2009 | Varga | 222/1 |
| 2011/0315028 A1 * | 12/2011 | Abe et al. | 101/114 |

FOREIGN PATENT DOCUMENTS

JP 2008-235761 * 10/2008
WO WO 2010/106741 * 9/2010

* cited by examiner

*Primary Examiner* — Michael Cleveland
*Assistant Examiner* — Austin Murata
(74) *Attorney, Agent, or Firm* — Cantor Colburn LLP; Ian MacKinnon

(57) ABSTRACT

A cartridge block for screening a multilayer ceramic with a conductive paste includes a threaded paste cartridge attachment located at a top of the cartridge block, the threaded paste cartridge attachment being configured to receive a paste cartridge containing the conductive paste; a paste routing section, the paste routing section located underneath the threaded paste cartridge attachment, the paste routing section comprising a flared section located at a bottom of the cartridge block, the paste routing section being configured to receive the conductive paste from the threaded paste cartridge attachment and route the paste through the flared section.

9 Claims, 7 Drawing Sheets

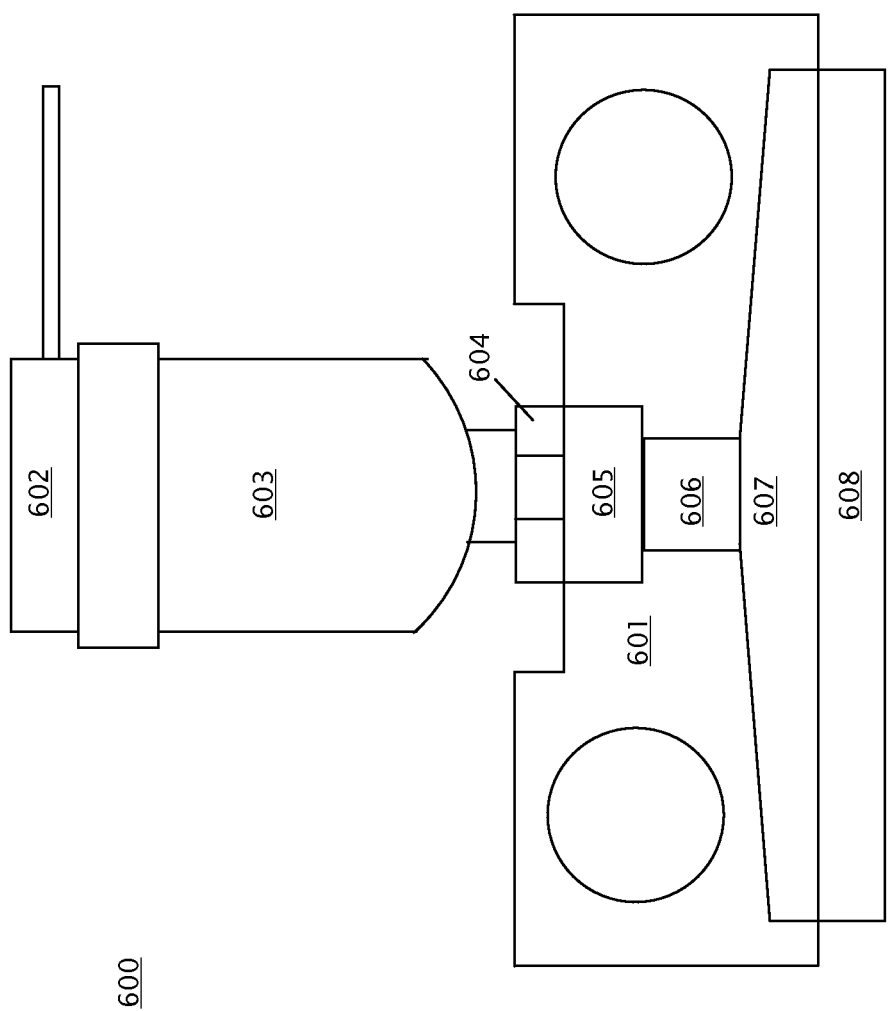

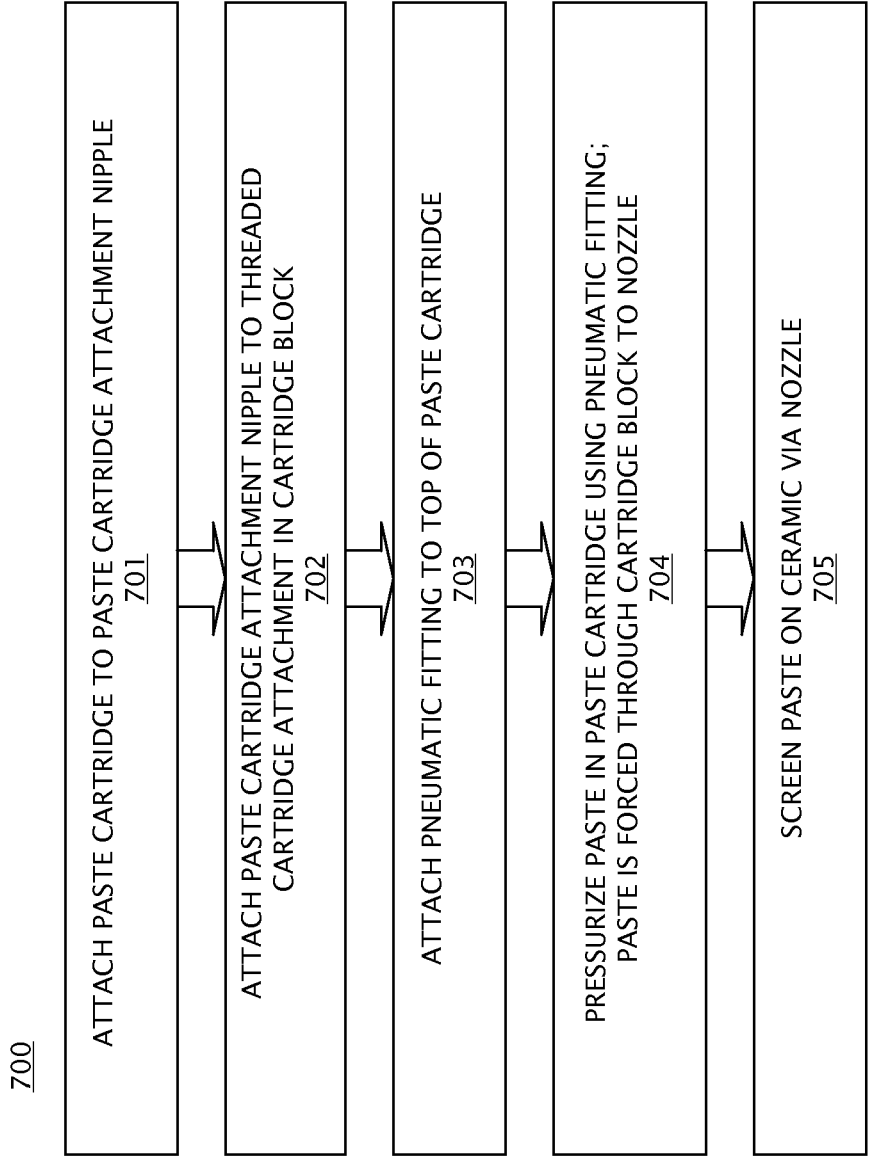

CARTRIDGE BLOCK FOR MULTILAYER CERAMIC SCREENING

FIELD OF INVENTION

This disclosure relates generally to the field of multilayer ceramic screening.

DESCRIPTION OF RELATED ART

Multilayer ceramic (MLC) semiconductor packages are formed by stacking and bonding together flexible paperlike sheets commonly referred to as ceramic green sheets. Green sheet segments of desired size and configuration are punched to provide via holes and, by a screen printing technique, a conductive paste (which may be a copper paste) fills the via holes and/or a conductive circuit pattern is applied to the face of the green sheet as required. Such green sheets, after screening, are assembled in a stack, pressed, and subsequently sintered in an oven at a relatively high temperature. Upon sintering, the vehicle and any binder material are burned off with the remaining rigid unitary ceramic body provided with interior interconnected conductive patterns. Additional processing occurs prior to the units being encapsulated.

Critical to the MLC manufacturing process is the screening operation. Screening is performed by extruding the paste from a paste tube though a metal mask to create the circuit pattern lines and to fill vias in the green sheets. The ceramic green sheets are relatively fragile, with a thickness that may be on the order of 0.008 inches, and a surface area that is relatively large compared to the thickness. Particular problems are encountered when screening such relatively soft and deformable, paper-thin, flexible green sheets, which are of no concern to the general screen printing art utilizing rigid substrates. Also, the conductive pastes used for MLC screening may be difficult to work with, thus complicating the screening process itself.

The conductive paste may be stored in cylindrical plastic paste cartridges after manufacture. The paste is then transferred from the paste cartridge to a specialized screening paste tube via paste transfer tooling in order to perform the screening process by extrusion of the paste from the tubes. This requires both specialized, complex paste transfer tooling, and a time-consuming transfer process to fill the paste tubes from the plastic cartridges. Once the paste tube is filled with the paste, the loaded paste tube is installed on a screening tool for the screening of greensheets. The paste tubes are mechanical assemblies that include many components, including a paste reservoir, shutter, shutter arms, shutter cylinder, plunger T-bar and a teflon insert. The reservoir section of a filled paste tube has a rectangular cross-section topped by a plunger T-bar with a teflon insert and finished at the bottom with a carbide rod nozzle through which screening is performed. Systems and methods for screening of greensheets using such paste tubes are discussed in further detail in U.S. Pat. No. 4,362,486 (Davis et al.), issued on Dec. 7, 1982 and assigned to International Business Machines Corporation, which is herein incorporated by reference in its entirety.

The paste tubes have several high wear components which may drive up the cost of the screening process, including the teflon insert, shutter cylinder, and shutter. The paste tubes are also relatively difficult to clean, requiring specialized cleaning tools and high temperature, high pressure cleaning chemicals. The paste tubes must be broken down into many parts prior to cleaning, and must be rebuilt after cleaning by a certified operator. The paste tubes must be broken down and cleaned frequently to ensure proper operation of the screening process, due to the many moving parts included in the paste tubes. The frequency and complexity of the paste tube cleaning process, in addition to the transfer of the paste from the paste cartridges to the paste tubes, reduces the overall throughput of the MLC screening process.

SUMMARY

In one aspect, a cartridge block for screening a multilayer ceramic with a conductive paste includes a threaded paste cartridge attachment located at a top of the cartridge block, the threaded paste cartridge attachment being configured to receive a paste cartridge containing the conductive paste; a paste routing section, the paste routing section located underneath the threaded paste cartridge attachment, the paste routing section comprising a flared section located at a bottom of the cartridge block, the paste routing section being configured to receive the conductive paste from the threaded paste cartridge attachment and route the paste through the flared section.

In another aspect, an assembly for screening a multilayer ceramic with a conductive paste includes a paste cartridge containing the conductive paste; a cartridge block, a top of a cartridge block being configured to receive the paste cartridge, the cartridge block comprising a paste routing section, the paste routing section comprising a flared section located at a bottom of the cartridge block; a pneumatic fitting attached to the paste cartridge, the pneumatic fitting configured to pressurize the conductive paste in the paste cartridge such that the conductive paste is extruded from the paste cartridge into the cartridge block through the paste routing section of the cartridge block by the pressure from the pneumatic fitting; and a nozzle connected to the flared section of the cartridge block, the nozzle configured to receive the conductive paste from the flared section, and screen the conductive paste onto the multilayer ceramic through the nozzle.

In another aspect, a method for screening a multilayer ceramic with a conductive paste includes attaching a paste cartridge containing the conductive paste to a top of a cartridge block, the cartridge block comprising a paste routing section, the paste routing section comprising a flared section located at a bottom of the cartridge block; attaching a pneumatic fitting to the paste cartridge, the pneumatic fitting configured to pressurize the conductive paste in the paste cartridge; extruding the conductive paste from the paste cartridge by the pressure from the pneumatic fitting; routing the conductive paste from the paste cartridge through the paste routing section of the cartridge block to a nozzle connected to the flared section at the bottom of the cartridge block; and screening the conductive paste onto the multilayer ceramic through the nozzle.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 6 illustrates an embodiment of an MLC screening assembly including a cartridge block, paste cartridge, pneumatic fitting, and nozzle.

FIG. 7 illustrates an embodiment of a method of MLC screening using a cartridge block and a paste cartridge.

DETAILED DESCRIPTION

Embodiments of a cartridge block for MLC screening and a method of MLC screening using a cartridge block are provided, with exemplary embodiments being discussed below in detail. An MLC screening paste tube may be replaced with a cartridge block assembly that allows the paste to be extruded directly from the paste cartridge in which the paste is stored through the cartridge block to a nozzle through which MLC screening is performed. Therefore, there is no need to transfer the paste from the paste cartridge into a paste tube before screening.

The cartridge block may be relatively easy to clean, using, for example, wipes and isopropyl alcohol. No specialized, high cost cleaning tools or high temperature, high pressurized cleaning chemicals may be required. The cartridge block has relatively few components, which may significantly reduce breakdown, rebuild, and maintenance time needed for the cartridge block assembly versus the paste tube. Further, the cartridge block may be used for more screening processes before needing to be broken down and cleaned as compared to the paste tube.

Figure 1:
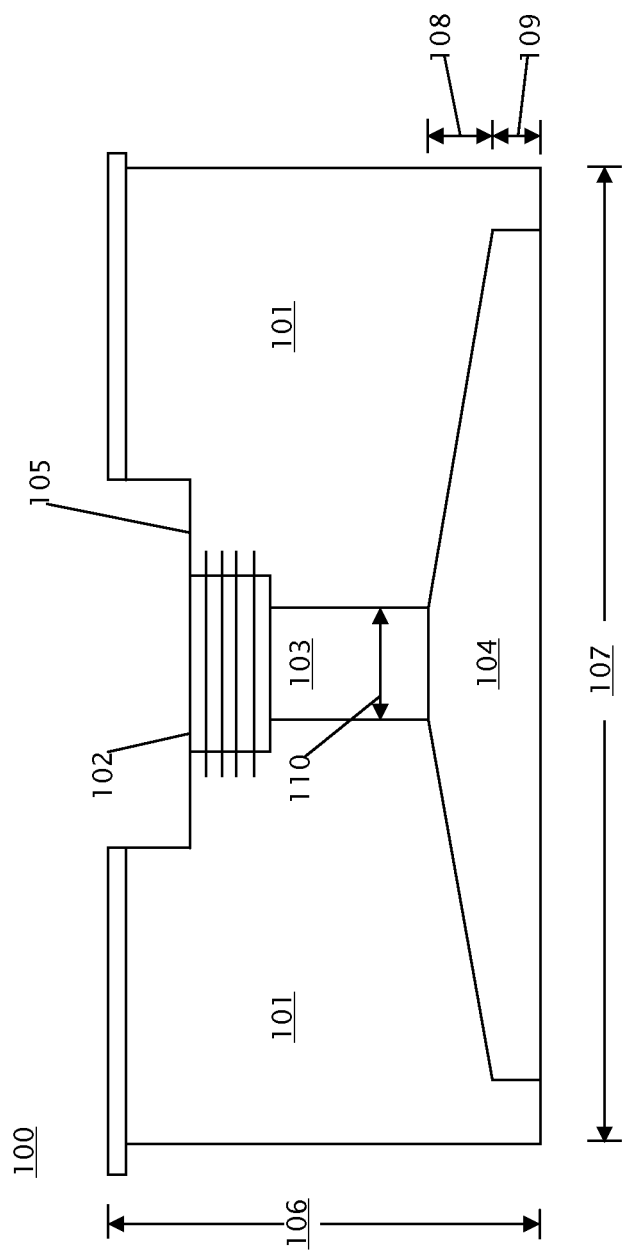
FIG. 1 illustrates a cross-section an embodiment of a cartridge block for MLC screening.

FIG. 1 illustrates a cross-section 100 of an embodiment of a cartridge block. Threaded cartridge attachment 102 is located at the top of the cartridge block body 101 in a recessed area 105. Below threaded cartridge attachment 102 is a paste routing section, including a hole 103 and beveled flared section 104. In operation, paste is forced through hole 103 and flared section 104 from threaded cartridge attachment 104. Flared section 104 causes the paste to flare out, to fully cover the surface of a nozzle attached to the cartridge block at the flared section (discussed further below with respect to FIG. 6). The cartridge block body 101 may have a height (indicated by line 106) of approximately 3.375" and a length (indicated by line 107) of approximately 8.5". A top angled portion of the flared section 104 may have a height (indicated by line 108) of approximately 0.15", and a bottom vertical portion of the flared section 104 may have a height (indicated by line 109) of approximately 0.1". The hole 103 may be round, with a diameter (indicated by line 110) of approximately 0.25". Dimensions 106-110 are given for illustrative purposes only; a cartridge block body 101 may be any appropriate size. The cartridge block body 101 may be made from a metal such as stainless steel in some embodiments, and the paste routing section, including hole 103 and beveled flared section 104, may be formed by milling the cartridge block body 101.

Figure 2:
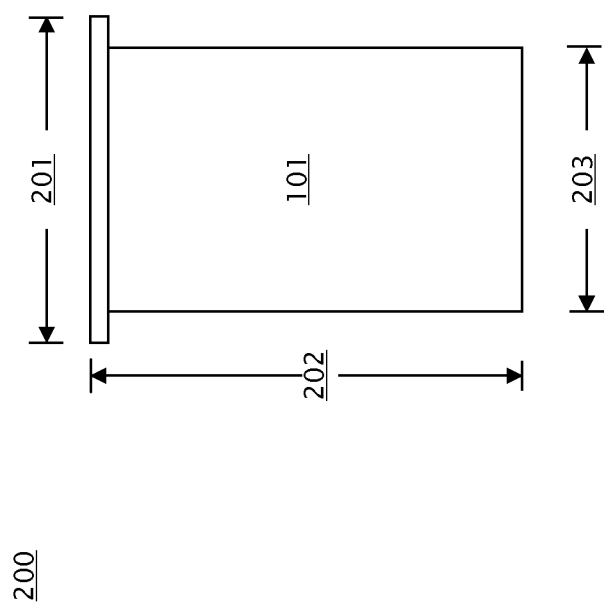
FIG. 2 illustrates a side view of the cartridge block for MLC screening of FIG. 1.

FIG. 2 illustrates a side view 200 of the cartridge block of FIG. 1. The cartridge block body 101 may have a top width (indicated by line 201) of approximately 1.5", a height (indicated by line 202) of approximately 3.375", and a bottom width (indicated by line 203) of approximately 0.96". Dimensions 201-203 are given for illustrative purposes only; a cartridge block body 101 may be any appropriate size.

Figure 3:
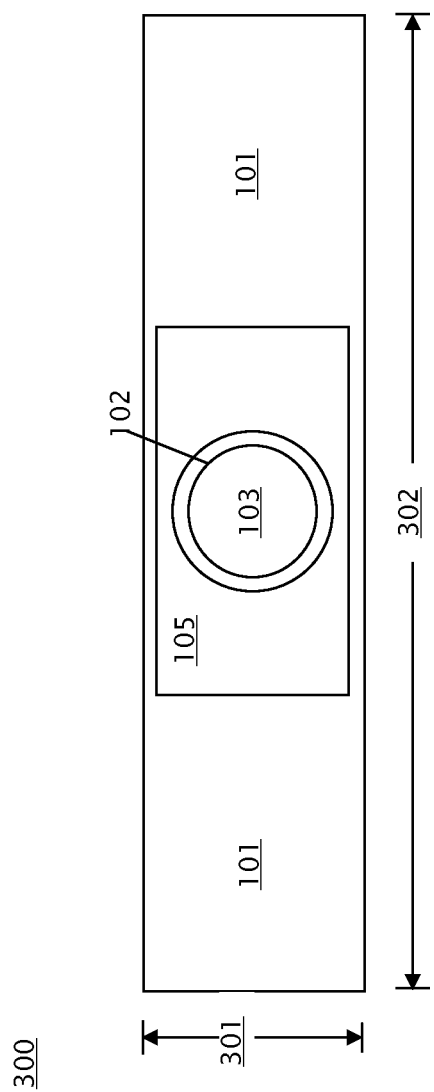
FIG. 3 illustrates a top view of the cartridge block for MLC screening of FIG. 1.

FIG. 3 illustrates a top view 300 of the cartridge block of FIG. 1. Cartridge block body 101 surrounds recessed area 105 and threaded cartridge attachment 102. The hole 103 is visible through the threaded cartridge attachment 102. The cartridge block body 101 may have a top width (indicated by line 301) of approximately 1.5", and a top length (indicated by line 302) of approximately 9". Dimensions 301-302 are given for illustrative purposes only; a cartridge block body 101 may be any appropriate size.

Figure 4:
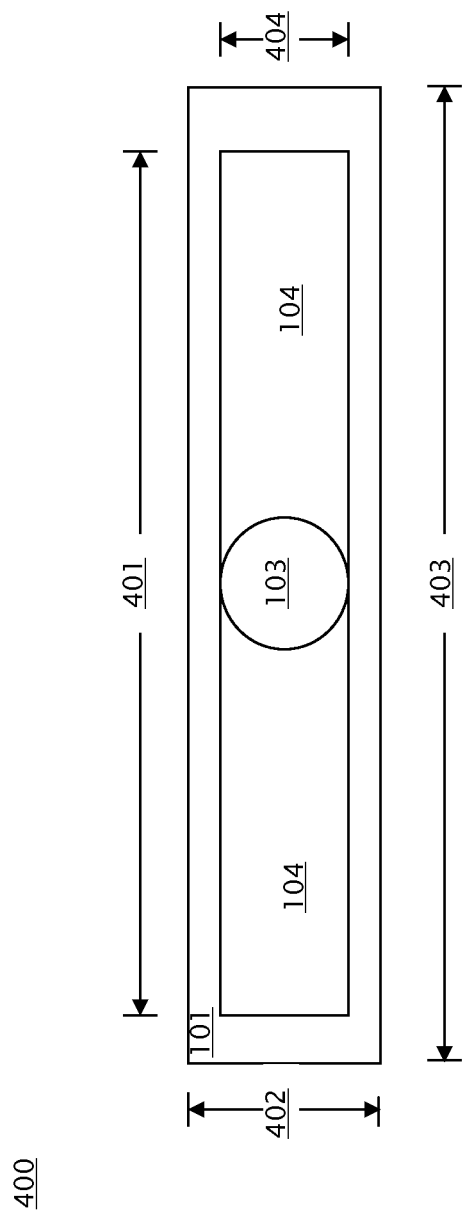
FIG. 4 illustrates a bottom view of the cartridge block for MLC screening of FIG. 1.

FIG. 4 illustrates an embodiment of a bottom view 400 of the cartridge block of FIG. 1. Cartridge block body 101 surrounds the flared section 104, and hole 103 is visible through flared section 104. The cartridge block body 101 may have a bottom width (indicated by line 402) of approximately 0.96", and a bottom length (indicated by line 403) of approximately 8.5". The flared section 104 may have a width (indicated by line 404) of approximately 0.25", and a length (indicated by line 401) of approximately 8.0". The length 401 and width 404 of flared section 104 may be determined by the dimensions of a nozzle that is attached to flared section 104 and used for the MLC screening process (discussed further below with respect to FIG. 6). Hole 103 may have a diameter of approximately 0.25". Dimensions 401-404 are given for illustrative purposes only; a cartridge block body 101 may be any appropriate size.

Figure 5:
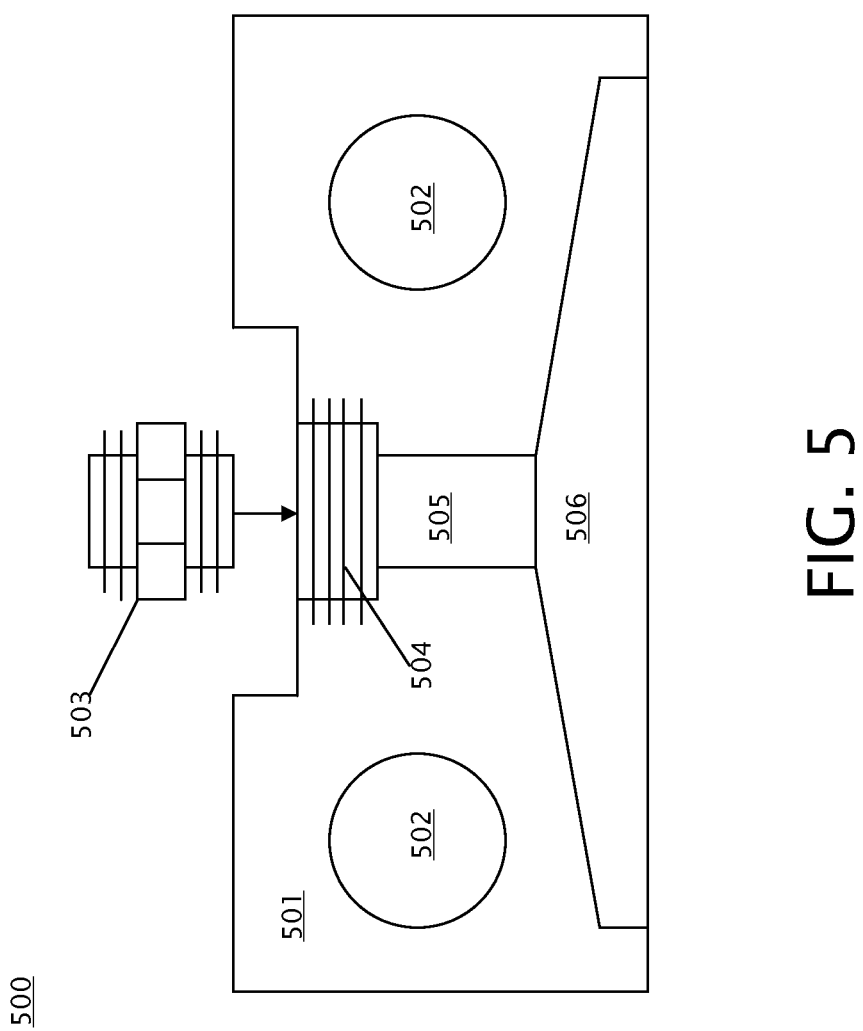
FIG. 5 illustrates an embodiment of a cartridge block and a paste cartridge attachment nipple for MLC screening.

FIG. 5 illustrates an embodiment of an assembly 500 including a cross section of a cartridge block 501 and a paste cartridge attachment nipple 503. The bottom of paste cartridge attachment nipple 503 is configured to attach (e.g., screw in) to threaded cartridge attachment 504 in cartridge block 501, and the top of paste cartridge attachment nipple 503 is configured to attach (e.g., screw in) to a paste cartridge. Cartridge block 501 also includes a paste routing section including hole 505 and flared section 506. Weight reduction holes 502 may also be milled in cartridge block 501 in some embodiments to reduce the weight of cartridge block 501. Weight reduction holes 502 are shown for illustrative purposes only; any appropriate configuration of holes may be formed in a cartridge block to reduce the weight of the cartridge block while maintaining the overall structural rigidity of the cartridge block that is necessary for the screening process. The paste cartridge attachment nipple 503 may be made from a metal such as stainless steel in some embodiments.

FIG. 6 illustrates an embodiment of an MLC screening assembly 600 including a cross section of a cartridge block 601, a paste cartridge 603, a pneumatic fitting 602, and a nozzle 608. Pneumatic fitting 602 attaches to the top of paste cartridge 603, and acts to pressurize the paste in paste cartridge 630 and force the paste out of the cartridge 603 and into the paste routing section of the cartridge block 601. Pneumatic fitting 602 may comprise a quick-connect pneumatic fitting. Past cartridge 603 may comprise a cylindrical plastic paste cartridge filled with a conductive paste (such as a copper paste) for MLC screening; the paste cartridge 603 may be used to store the conductive paste after manufacture. Paste cartridge 603 attaches to paste cartridge attachment nipple 604, which is attached to threaded cartridge attachment 605. When pneumatic fitting 602 pressurizes and forces paste out of paste cartridge 603, the paste travels from paste cartridge 603 via paste cartridge attachment nipple 604 and threaded cartridge attachment 605 through hole 606 and flared section 607 to nozzle 608. Flared section 607 causes the paste to flare out and fill a screening surface of the nozzle 608. The paste is then screened onto a ceramic substrate through the nozzle 608. The dimensions of flared section 607 are commensurate with the dimensions of nozzle 608. Nozzle 608 may be a carbide rod nozzle in some embodiments.

FIG. 7 illustrates an embodiment of a method 700 of MLC screening using a cartridge block and a paste cartridge. FIG. 7 is discussed with reference to FIG. 6. In block 701, the paste cartridge 603 is attached to the paste cartridge attachment nipple 604. In block 702, the paste cartridge attachment nipple 604 is attached to the threaded cartridge attachment 605 in the cartridge block 601. In block 703, the pneumatic fitting 602 is attached to the top of the paste cartridge 603. In block 704, the conductive paste in the paste cartridge 603 is pressurized using the pneumatic fitting 602, such that the paste is forced through the hole 606 and flared section 607 of the cartridge block 601 to the nozzle 608. In block 705, the paste is screened onto a multilayer ceramic via the nozzle 608. The screening may be performed in order to, for example, fill a via hole in the multilayer ceramic, or form a conductive circuit pattern on the multilayer ceramic.

The technical effects and benefits of exemplary embodiments include increased throughput for an MLC screening process, through elimination of paste transfer from a cartridge to a specialized screening tube, and also reduction of maintenance and cleaning time for the screening apparatus.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for screening a multilayer ceramic with a conductive paste, the method comprising:
    attaching a paste cartridge containing the conductive paste to a top of a cartridge block, the cartridge block comprising a paste routing section, the paste routing section comprising a flared section located at a bottom of the cartridge block, wherein attaching the paste cartridge containing the conductive paste to the top of the cartridge block comprises:
        attaching a top side of a paste cartridge attachment nipple to the paste cartridge; and
        attaching a bottom side of the paste cartridge attachment nipple to a threaded cartridge attachment on the top of the cartridge block;
    attaching a pneumatic fitting to the paste cartridge, the pneumatic fitting configured to pressurize the conductive paste in the paste cartridge;
    extruding the conductive paste from the paste cartridge by the pressure from the pneumatic fitting;
    routing the conductive paste from the paste cartridge through the paste routing section of the cartridge block to a nozzle connected to the flared section at the bottom of the cartridge block; and
    screening the conductive paste onto the multilayer ceramic through the nozzle.

2. The method of claim 1, wherein the conductive paste comprises a copper paste.

3. The method of claim 1, wherein the paste routing section further comprises a hole located between the threaded cartridge attachment and the flared section.

4. The method of claim 1, wherein the paste cartridge attachment nipple comprises stainless steel.

5. The method of claim 1, wherein the paste cartridge comprises a cylindrical plastic paste cartridge.

6. The method of claim 1, wherein the cartridge block comprises stainless steel.

7. The method of claim 1, wherein the nozzle comprises a carbide rod nozzle.

8. The method of claim 1, wherein screening the conductive paste onto the multilayer ceramic through the nozzle comprises filling a via hole in the multilayer ceramic.

9. The method of claim 1, wherein screening the conductive paste onto the multilayer ceramic through the nozzle comprises forming a conductive circuit pattern on the multilayer ceramic.

\* \* \* \* \*